US009406517B2

(12) United States Patent
Vellianitis

(10) Patent No.: US 9,406,517 B2
(45) Date of Patent: Aug. 2, 2016

(54) SIGE SURFACE PASSIVATION BY GERMANIUM CAP

(71) Applicant: Taiwan Semiconductor Manufacturing Co. Ltd., Hsin-Chu (TW)

(72) Inventor: Georgios Vellianitis, Heverlee (BE)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 122 days.

(21) Appl. No.: 13/794,914

(22) Filed: Mar. 12, 2013

(65) Prior Publication Data

US 2014/0264443 A1    Sep. 18, 2014

(51) Int. Cl.
| H01L 29/165 | (2006.01) |
| H01L 21/28 | (2006.01) |
| H01L 29/51 | (2006.01) |
| H01L 29/66 | (2006.01) |
| H01L 29/78 | (2006.01) |
| H01L 29/10 | (2006.01) |
| H01L 29/267 | (2006.01) |

(52) U.S. Cl.
CPC ...... H01L 21/28255 (2013.01); H01L 29/1054 (2013.01); H01L 29/165 (2013.01); H01L 29/513 (2013.01); H01L 29/6659 (2013.01); H01L 29/7833 (2013.01); H01L 29/267 (2013.01); H01L 29/517 (2013.01)

(58) Field of Classification Search
CPC ............ H01L 21/28255; H01L 29/1054; H01L 29/165; H01L 29/267
USPC .......................................................... 257/192
See application file for complete search history.

(56) References Cited

U.S. PATENT DOCUMENTS

| 6,620,664 B2 | 9/2003 | Ma et al. | |
| 2008/0128750 A1* | 6/2008 | Enicks ................ | H01L 29/1054 257/191 |
| 2010/0237444 A1* | 9/2010 | Lin ................... | H01L 21/02175 257/411 |

(Continued)

FOREIGN PATENT DOCUMENTS

KR    20100105462 A    9/2010

OTHER PUBLICATIONS

Wolf et al.; Silicon Processing for the VLSI Era, vol. 1: Process Technology; Lattice Press, Sunset Beach, California; Year 1986; pp. 156-157.*

(Continued)

*Primary Examiner* — Marcos D Pizarro
(74) *Attorney, Agent, or Firm* — Eschweiler & Associates, LLC

(57) ABSTRACT

The present disclosure relates to a transistor device having a germanium cap layer that is able to provide for a low interface trap density, while meeting effective oxide thickness scaling requirements, and a related method of fabrication. In some embodiments, the disclosed transistor device has a channel layer disposed within a semiconductor body at a location between a source region and a drain region. A germanium cap layer is disposed onto the channel layer. A gate dielectric layer is separated from the channel layer by the germanium cap layer, and a gate region is disposed above the gate dielectric layer. Separating the gate dielectric layer from the channel layer allows for the germanium cap layer to prevent diffusion of atoms from the channel layer into the gate dielectric layer, thereby provide for a low interface trap density.

20 Claims, 3 Drawing Sheets

(56) References Cited

U.S. PATENT DOCUMENTS

| | | |
|---|---|---|
| 2011/0309450 A1* | 12/2011 | Shifren et al. .............. 257/369 |
| 2012/0241875 A1* | 9/2012 | Tezuka ...................... 257/411 |
| 2012/0261754 A1* | 10/2012 | Cheng et al. .............. 257/347 |
| 2013/0277746 A1* | 10/2013 | Baldauf et al. ............ 257/368 |

OTHER PUBLICATIONS

Office Action dated Jul. 30, 2014 for Korean Patent Application No. 10-2013-0103944.

* cited by examiner

SIGE SURFACE PASSIVATION BY GERMANIUM CAP

BACKGROUND

Silicon germanium (SiGe) is a semiconductor material that has a band gap that is smaller than that of silicon and which can be controlled by varying the germanium content. In recent years, the use of silicon germanium for advanced metal oxide semiconductor field effect transistor (MOSFET) devices has been widely investigated. Silicon germanium used in combination with silicon produces a heterojunction that provides for a transistor device having a low junction leakage and high mobility. Such high mobility is attractive in high speed devices, for example.

DETAILED DESCRIPTION

Figure 1:
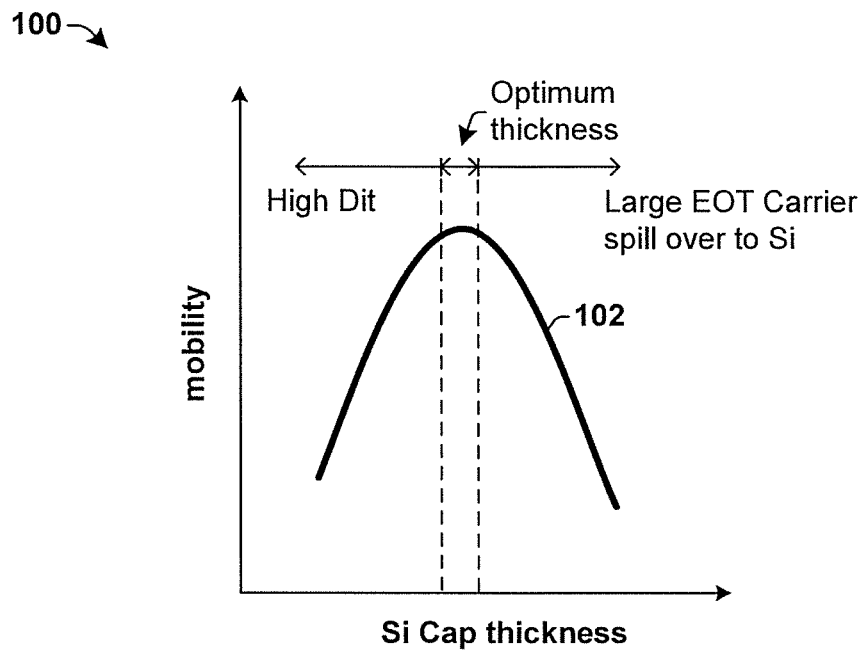
FIG. 1 illustrates a graph showing electron mobility as a function of silicon cap layer thickness.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Silicon germanium metal oxide semiconductor field effect transistors (MOSFETs) have a silicon germanium (SiGe) channel that extends between a source region and a drain region. A gate region, configured to control the flow of charge carriers from the source region to the drain region, is separated from the SiGe channel by a gate dielectric layer, which may have a gate oxide layer and a dielectric layer. If the SiGe channel and gate dielectric layer abut one another, germanium atoms from the SiGe channel can diffuse into the dielectric layer, forming recombination centers that reduce charge carrier mobility. The germanium atoms may also diffuse into the gate oxide layer forming a high interface state density between the SiGe surface and the gate oxide. To avoid these problems, a thin silicon cap layer is typically located between the SiGe channel and the gate dielectric layer. The silicon cap layer prevents contact between the SiGe channel and the gate dielectric layer, thereby preventing diffusion of germanium atoms from the SiGe channel to the gate dielectric layer and reducing interface state density.

In emerging technology nodes, the thickness of the silicon cap layer has been continually reduced in order to meet equivalent oxide thickness specifications. However, it has been appreciated that if the silicon cap layer is not formed to an optimum thickness (e.g., between 8 angstroms and 16 angstroms), the benefits of the SiGe channel are degraded. For example, FIG. 1 is a graph 100 illustrating a trend line 102 showing electron mobility (y-axis) as a function of silicon cap layer thickness (x-axis).

As shown by graph 100, if the silicon cap layer is too thin, germanium atoms are able to diffuse to a top of the silicon cap layer, transforming the silicon cap layer into a silicon germanium layer. Oxidation of the silicon germanium layer will form a silicon germanium oxide having a high interface trap density (Dit) that captures mobile charge carriers, providing for a low mobility. Alternatively, if the silicon cap layer is too thick, the silicon cap layer becomes a part of the channel resulting in a high effective oxide thickness (EOT) and partial or full carrier spill over to the silicon cap layer that reduces mobility. In advanced technology nodes, even a silicon cap layer formed to an optimal thickness is not able to meet the balance between an EOT scaling (e.g., to below 1 nm) and a high mobility.

Accordingly, the present disclosure relates to a transistor device having a germanium cap layer that is able to provide for a low interface trap density, while meeting EOT scaling requirements. In some embodiments, the disclosed transistor device comprises a channel layer disposed within a semiconductor body at a location between a source region and a drain region. A germanium cap layer is disposed onto the channel layer. A gate dielectric layer is separated from the channel layer by the germanium cap layer, and a gate region is disposed above the gate dielectric layer. Separating the gate dielectric layer from the channel layer allows for the germanium cap layer to prevent diffusion of atoms from the channel layer into the gate dielectric layer, thereby provide for a low interface trap density.

Figure 2:
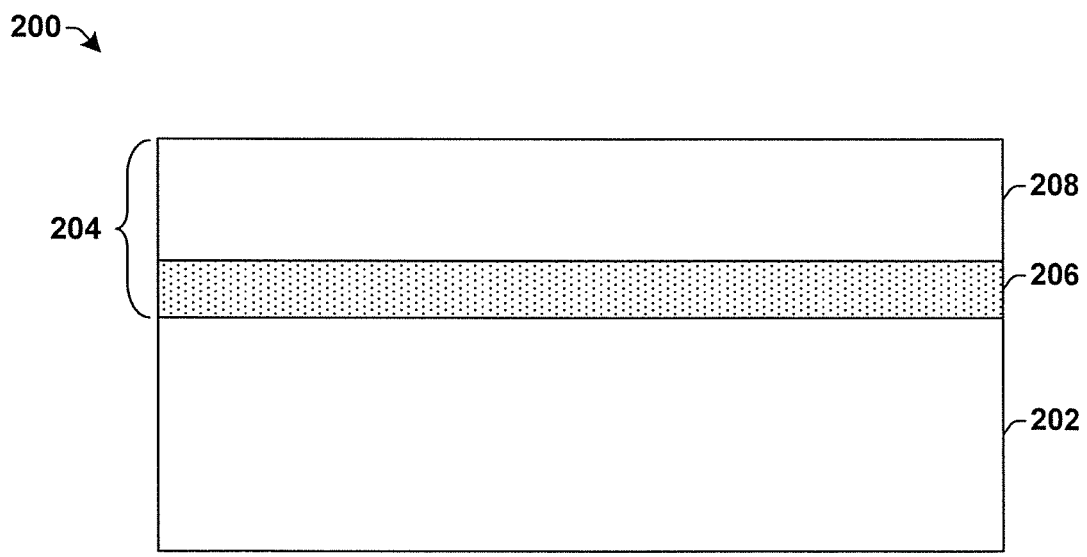
FIG. 2 illustrates a block diagram of some embodiments of a semiconductor substrate having a germanium cap layer.

FIG. 2 illustrates a block diagram of some embodiments of a semiconductor substrate 200 comprising a germanium cap layer.

The semiconductor substrate 200 comprises a channel layer 202. In some embodiments, the channel layer 202 may comprise a silicon germanium layer having a silicon germanium alloy with a molar composition of $Si_{1-x}Ge_x$, wherein the germanium content, x, ranges from 0 to 1. In some embodiments, the germanium content may be greater than 0.25 (i.e., x>0.25). In other embodiments, the channel layer 202 may comprise a III-V semiconductor material having an alloy comprising a combination of group III material (i.e., group 13 on the periodic table) and group V material (i.e., group 15 on the periodic table). For example, in some embodiments, the channel layer 202 may comprise gallium arsenide (GaAs), indium phosphide (InP), aluminum gallium arsenide (AlGaAs), indium arsenide (InAs), or any other similar III-V material.

A gate dielectric region 204 is located above the channel layer 202. In some embodiments, the gate dielectric region 204 comprises a germanium cap layer 206 and a gate dielectric layer 208. In some embodiments, the germanium cap layer 206 is disposed on the channel layer 202. The germanium cap layer 206 comprises a layer of undoped germanium. In some embodiments, the germanium cap layer 206 may have a thickness in a range of between approximately 10 angstroms and approximately 20 angstroms (i.e., between 5 and 10 monolayers).

The gate dielectric layer 208 is located above the germanium cap layer 206. The gate dielectric layer 208 is separated from the channel layer 202 by way of the germanium cap layer 206. In some embodiments, the gate dielectric layer 208 may comprise a layer of silicon dioxide having a thickness of between approximately 1 nm and 5 nm. In other embodiments, the gate dielectric layer 208 may comprise a high-k dielectric material.

The germanium cap layer 206 is configured to passivate the channel layer 202 (i.e., to prevent diffusion of atoms from the channel layer 202 into the gate dielectric layer 208). Since germanium atoms that diffuse into the germanium cap layer 206 do not cause interface traps, the germanium cap layer 206 is able to passivate the channel layer 202 without increasing a high interface trap density. Therefore, by separating the gate dielectric layer 208 and the channel layer 202 with the germanium cap layer 206, diffusion of germanium atoms from the channel layer 202 into a gate dielectric layer 208 is prevented, without increasing the interface trap density.

Furthermore, the germanium cap layer 206 has a dielectric constant (k=16) that is larger than that of a silicon cap layer (k≈11.9). The larger dielectric constant allows for the germanium cap layer 206 to provide a lower equivalent oxide thickness (EOT) than that of a silicon cap layer. Therefore, the germanium cap layer 206 can have a greater thickness than a silicon cap layer, since the value of the dielectric constant is higher, making fabrication of the semiconductor substrate 200 easier. For example, for a channel layer 202 having a silicon germanium material or a III-V material, the germanium cap layer 206 mitigates scaling issues due to its thickness enabled by its high dielectric constant.

Figure 3:
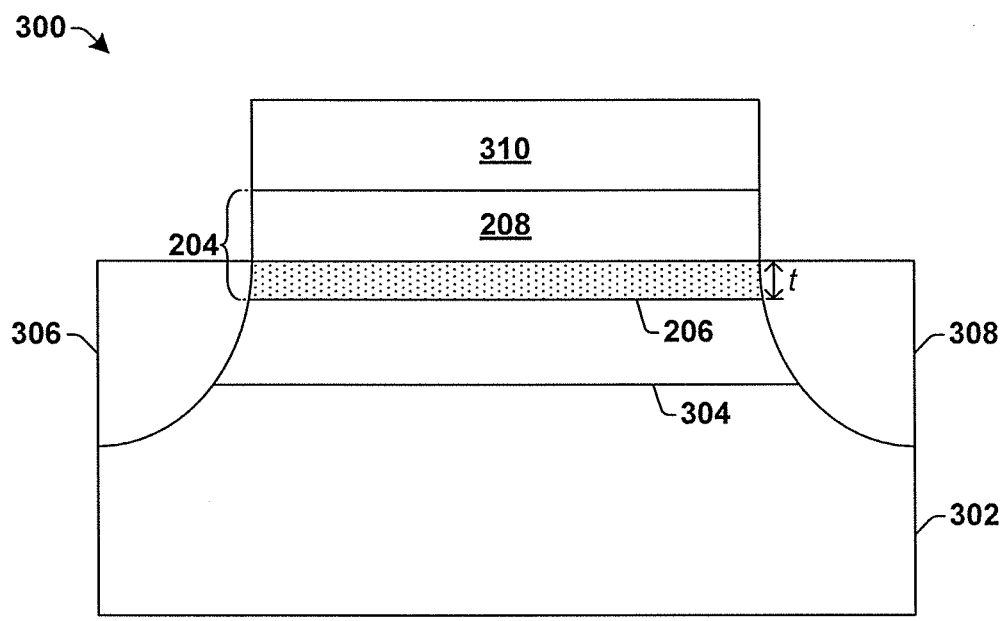
FIG. 3 illustrates a cross-sectional view of some embodiments of a silicon germanium (SiGe) MOSFET device having a germanium cap layer.

FIG. 3 illustrates a cross-sectional view of some embodiments of a silicon germanium (SiGe) MOSFET device 300 as provided herein.

The SiGe MOSFET device 300 comprises a semiconductor substrate 302. In some embodiments, the semiconductor substrate 302 may comprise a silicon substrate. In some embodiments, the semiconductor substrate 302 may have a first doping type (e.g., an n-type doping). In some embodiments, the semiconductor substrate may comprise a doped epitaxial layer disposed onto a semiconductor body comprising a bulk silicon substrate.

The SiGe MOSFET device 300 further comprises a silicon germanium layer 304 disposed onto the semiconductor substrate 302. The silicon germanium layer 304 operates as a channel of the SiGe MOSFET device 300. In some embodiments, the silicon germanium layer 304 is doped with a first dopant type (e.g., an n-type dopant or a p-type dopant). In some embodiments, the silicon germanium layer 304 comprises a silicon germanium alloy having a molar composition of $Si_{1-x}Ge_x$, where x=0.25 to 1. For example, in some embodiments, the silicon germanium alloy may have a value of x=1, such that the silicon germanium layer 304 comprises a pure germanium layer. In some embodiments, the silicon germanium layer 304 may have a thickness of several microns.

A gate dielectric region 204 is located above the silicon germanium layer 304. The gate dielectric region 204 comprises a germanium cap layer 206 disposed onto the silicon germanium layer 304. The germanium cap layer 206 comprises undoped germanium having a thickness t of with an upper limit of approximately 20 angstroms (i.e., t≤20 angstroms). The upper limit on the thickness of the germanium cap layer 206 prevents the germanium cap layer 206 from becoming a part of the underlying silicon germanium layer 304, so that the germanium cap layer 206 does not become populated by charge carriers.

The gate dielectric region 204 further comprises a gate dielectric layer 208 located above the germanium cap layer 206. In various embodiments, the gate dielectric layer 208 may comprise silicon dioxide ($SiO_2$) and/or a high-k dielectric material. As the germanium cap layer 206 becomes thinner, the diffusion of germanium atoms from the silicon germanium layer 304 into the germanium cap layer 206 does not increase the interface trap density, thereby mitigating scaling concerns of the germanium cap layer 206.

A gate region 310 is located above the gate dielectric layer 208. In some embodiments, the gate region 310 may comprise a polysilicon material. In other embodiments, the gate region 310 may comprise a metal gate (e.g., an aluminum gate, a tungsten gate, etc.). A source region 306 and a drain region 308 are located at opposite ends of the silicon germanium layer 304. The source and drain region comprise highly doped regions (e.g., having doping concentrations of between $1\times10^{17}$ atoms/cm$^3$-$1\times10^{20}$ atoms/cm$^3$) having a second dopant type that is opposite that of the of the silicon germanium layer 304. During operation charge carriers flow between the source region 306 and drain region 308, depending upon a bias voltage applied to the gate region 310, by way of the silicon germanium layer 304, which acts as a channel for the SiGe MOSFET device 300.

It will be appreciated that the disclosed SiGe MOSFET device 300 may comprise an n-type SiGe FET or a p-type SiGe MOSFET. For example, in some embodiments, the SiGe MOSFET device 300 may comprise a n-type SiGe MOSFET having a silicon germanium layer 304 with a p-type doping (e.g., having a doping concentration of between approximately $1\times10^{15}$ atoms/cm$^3$ and approximately $1\times10^{17}$ atoms/cm$^3$) located between source and drain regions, 306 and 308, having a n-type doping. In other embodiments, the SiGe MOSFET device 300 may comprise an p-type SiGe MOSFET having a silicon germanium layer 304 with an n-type doping (e.g., having a doping concentration of approximately $1\times10^{15}$ atoms/cm$^3$ and approximately $1\times10^{17}$ atoms/cm$^3$) located between source and drain regions, 306 and 308, having a p-type doping.

Figure 4:
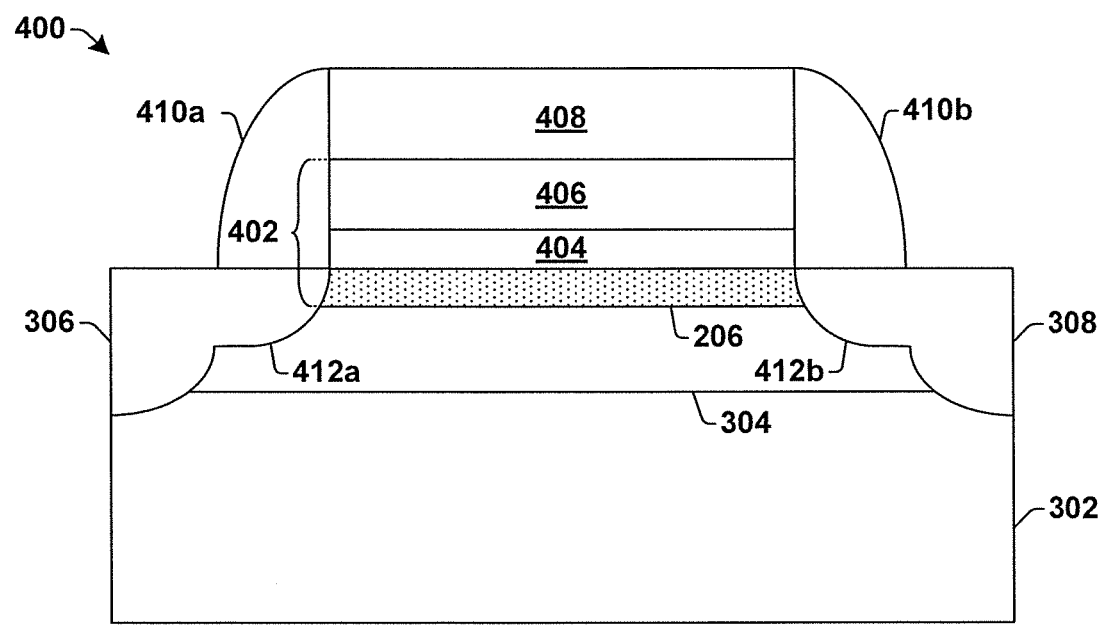
FIG. 4 illustrates a cross-sectional view of some alternative embodiments of a silicon germanium (SiGe) MOSFET device having a germanium cap layer.

FIG. 4 illustrates a cross-sectional view of some alternative embodiments of a silicon germanium (SiGe) MOSFET device 400 having a germanium cap layer 206.

SiGe MOSFET device 400 comprises a gate dielectric region 402 located above the silicon germanium layer 304. The gate dielectric region 402 comprises a germanium cap layer 206, a germanium oxide layer 404, and a high-k dielectric layer 406. The germanium oxide layer 404 ($GeO_2$) separates the silicon germanium layer 304 from the high-k dielectric layer 406. A high-k metal gate 408 is disposed onto the high-k dielectric layer 406.

The germanium cap layer 206, the germanium oxide layer 404, and the high-k dielectric layer 406 collectively provide for an equivalent oxide thickness (EOT) of the SiGe MOSFET device 400. The EOT is the thickness of a silicon dioxide ($SiO_2$) gate oxide needed to obtain the same gate capacitance as the one obtained with thicker than $SiO_2$ dielectric featuring higher dielectric constant k (e.g., an EOT of 1 nm would result from the use a 10 nm thick dielectric featuring k=39 (k of $SiO_2$ is 3.9)). While EOT scaling issues arise with a silicon cap layer, such scaling issues are not present with the germanium cap layer 206. This is because the high dielectric constant of germanium decreases the EOT of the dielectric layer. For example, the EOT of the germanium cap layer 206 and the germanium oxide layer 404 is determined by the equation:

$$EOT_{Ge} = EOT_{ox} + 3.9 d_{Ge}/16,$$

while the EOT of a silicon cap layer and a silicon oxide layer is determined by the equation:

$$EOT_{si}=EOT_{ox}+3.9*d_{Si}/11.9.$$

In some embodiments, sidewall spacers 410a and 410b may be located on opposing sides of high-k metal gate 408. In some embodiments, the sidewall spacers, 410a and 410b, may comprise an insulating material such as an oxide, a nitride or a combination of such layers. A source region 306 and a drain region 308 are located on opposite ends of the silicon germanium layer 304, so that the germanium cap layer 206 is located at a position that is laterally between the source region 306 and the drain region 308. In some embodiments, the source region 306 and the drain region 308 may respectively comprise a source extension region 412a and a drain extension region 412b. The source extension region 412a and a drain extension region 412b respectively extend to a located below the sidewall spacers 410a and 410b.

Figure 5:
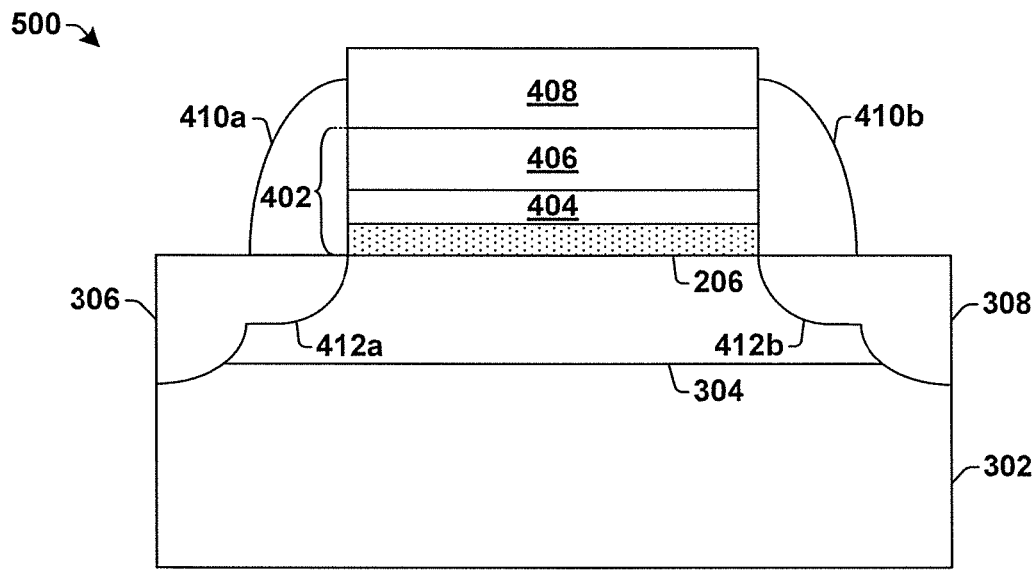
FIG. 5 illustrates a cross-sectional view of some alternative embodiments of a silicon germanium (SiGe) MOSFET device having a germanium cap layer.

FIG. 5 illustrates a cross-sectional view of some alternative embodiments of a silicon germanium (SiGe) MOSFET device 500 having a germanium cap layer 206. If not otherwise noted, the reference numerals shown in FIG. 5 correspond to the description of the reference numerals as provided in relation to FIG. 4.

SiGe MOSFET device 500 comprises gate dielectric region 402 located above the silicon germanium layer 304. The gate dielectric region 402 comprises a germanium cap layer 206, a germanium oxide layer 404, and a high-k dielectric layer 406. The germanium oxide layer 404 ($GeO_2$) separates the silicon germanium layer 304 from the high-k dielectric layer 406. A high-k metal gate 408 is disposed onto the high-k dielectric layer 406. A source region 304 and a drain region 306 are located at opposite ends of the silicon germanium layer 304. The germanium cap layer 206 is located at a position that is over the silicon germanium layer 304 and that is vertically above the source region 306 and the drain region 308.

Figure 6:
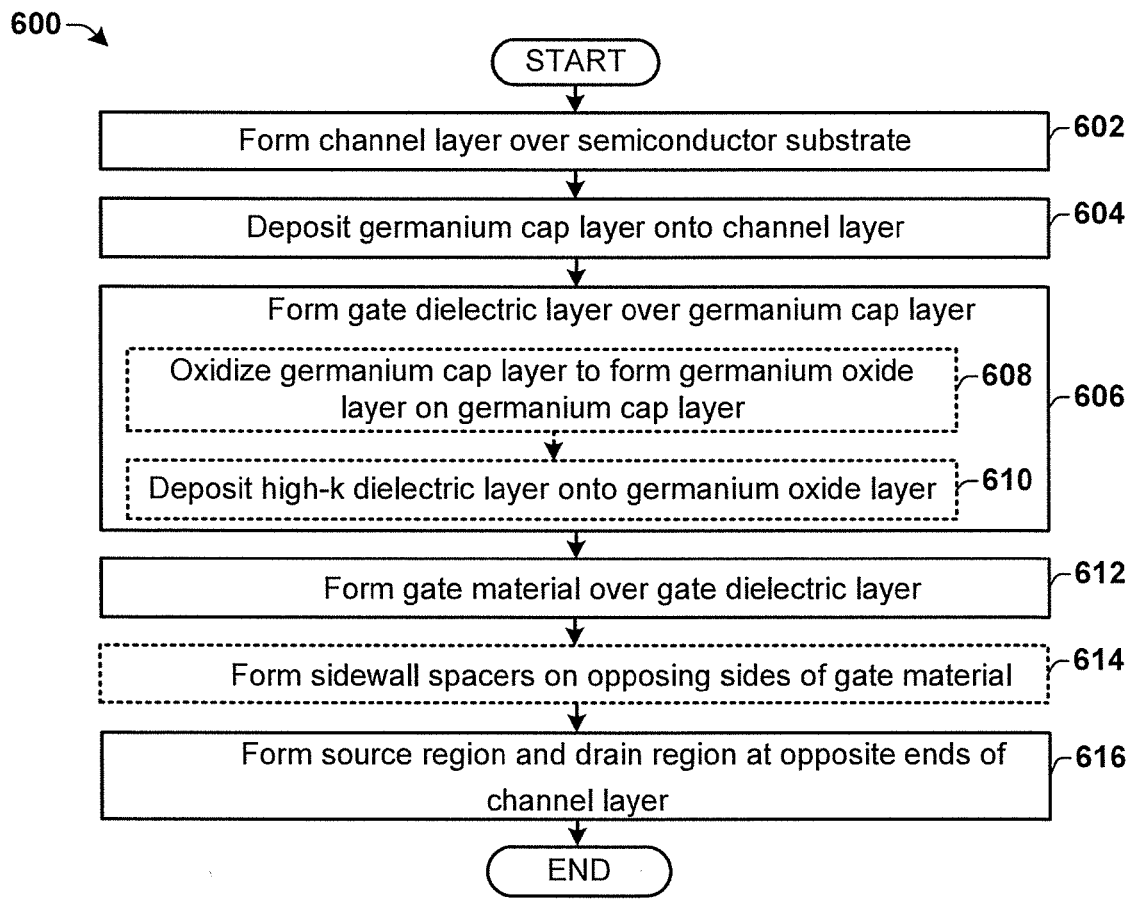
FIG. 6 is a flow diagram of some embodiments of a method of forming a transistor device having a germanium cap layer.

FIG. 6 is a flow diagram of some embodiments of a method 600 of making a semiconductor device having a germanium cap layer.

While the disclosed method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 602, a channel layer is formed over a semiconductor substrate. In some embodiments the channel layer may comprise a silicon germanium layer formed onto a silicon substrate. In other embodiments the channel layer may comprise a III-V semiconductor material (e.g., gallium arsenide (GaAs), indium phosphide (InP), aluminum gallium arsenide (AlGaAs), indium arsenide (InAs)) formed onto a semiconductor substrate. In some embodiments, the channel layer may be formed onto the semiconductor substrate by way of a deposition technique (e.g., chemical vapor deposition, physical vapor deposition, etc.) or an epitaxial growth. In some embodiments the channel layer may be formed to a thickness of between approximately 1 micron and approximately 10 microns, for example. In other embodiments, the channel layer may be formed to a thickness that is greater than 10 microns or less than 1 micron.

In various embodiments, the channel layer may be doped to form an n-type device (i.e., a p-channel device) or a p-type device (i.e., an n-channel device). For example, in some embodiments, wherein the transistor device comprises a p-type MOSFET, the channel layer may comprise an n-type doping concentration so that charge carriers comprising holes conduct in the channel layer. In other embodiments, wherein the transistor device comprises an n-type MOSFET, the channel layer may comprise a p-type doping concentration so that charge carriers comprising electrons conduct in the channel layer.

At act 604, a germanium cap layer is formed onto the channel layer. The germanium cap layer comprises an undoped layer of germanium. In some embodiments, the germanium cap layer may be formed onto the semiconductor substrate by way of a growth technique such as molecular beam epitaxial (MBE). In such embodiments, a germanium source material is heated until it sublimes and is subsequently deposited onto the channel layer. In other embodiments, the germanium cap layer may be formed onto the semiconductor substrate by way of a chemical vapor deposition technique (e.g., low-pressure chemical vapor deposition (LPCVD), ultra-high vacuum chemical vapor deposition (UHV-CVD), etc.). In some embodiments, the germanium cap layer may be formed to a thickness having a range of between approximately 10 angstroms and approximately 20 angstroms (i.e., between 5 and 10 monolayers).

At act 606, a gate dielectric layer is formed over the germanium cap layer. In some embodiments, the gate dielectric layer comprises a germanium oxide layer and a high-k dielectric film. In such embodiments, the germanium cap layer may be oxidized by way of a thermal process to form a germanium oxide layer on the germanium cap layer, at 608. For example, in some embodiments, the gate dielectric layer may be formed by exposing the germanium cap layer to an $O_2$ atmosphere at a temperature of between 600° C. and 900° C. to form a germanium oxide layer having a thickness of between approximately 1 nm and 5 nm. Once the germanium oxide layer has been formed, a high k-dielectric layer is formed onto the germanium oxide layer, at 610. In some embodiments, the high k-dielectric layer may comprise a high-k metal gate material (e.g., hafnium silicate, hafnium dioxide, etc.) deposited by way of atomic layer deposition (ALD) or metal organic chemical vapor deposition (MOCVD).

At act 612, a gate region comprising a gate material is formed over the gate dielectric layer. In some embodiments, the gate material may comprise a polysilicon material deposited by way of a deposition technique. In other embodiments, the gate material may comprise a high-k metal gate material (e.g., aluminum) deposited by way of atomic layer deposition or a vapor deposition technique (e.g., physical vapor deposition or chemical vapor deposition).

At act 614, sidewall spacers may be formed on opposing sides of the gate material. The sidewall spacers are formed by depositing a layer of dielectric material (e.g., an oxide, a nitride or a combination of such layers) over the substrate and then selectively etching the dielectric material (e.g., to remove the dielectric material from a top of the gate structure and from active areas).

At act 616, a source region and a drain region are formed at opposing ends of the channel layer. The source region and the drain region may be formed by selectively implanting the substrate in the source and drain regions to have a high dopant concentration (e.g., $1 \times 10^{17}$ atoms/cm$^3$-$1 \times 10^{20}$ atoms/cm$^3$). In some embodiments, the source and drain region may comprise a doping type that is opposite the doping type of the channel layer.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a transistor device having a germanium cap layer that is able to provide for a low interface trap density, while meeting effective oxide thickness scaling requirements.

In some embodiments, the present disclosure relates to a transistor device. The transistor device comprises a channel layer disposed within a semiconductor body at a location between a source region and a drain region. A germanium cap layer disposed onto the channel layer. A gate dielectric layer, separated from the channel layer by the germanium cap layer, is configured to prevent diffusion of atoms from the channel layer into the gate dielectric layer. A gate region is disposed over the gate dielectric layer and is configured to control a flow of charge carriers between the source region and the drain region.

In other embodiments, the present disclosure relates to a silicon germanium (SiGe) transistor device. The SiGe transistor device comprises a silicon germanium layer comprising a silicon germanium alloy having a molar composition of $Si_{1-x}Ge_x$, wherein x is greater than 0.25. The SiGe transistor device further comprises a germanium cap layer disposed onto the silicon germanium layer. The SiGe transistor device further comprises a high-k dielectric layer disposed onto the germanium cap layer, wherein the germanium cap layer is configured to prevent diffusion of germanium atoms from the silicon germanium layer into the high-k dielectric layer.

In other embodiments, the present disclosure relates to a method of forming a transistor device. The method comprises forming a channel layer over a semiconductor body. The method further comprises forming a germanium cap layer onto the channel layer. The method further comprises forming a gate dielectric layer over the germanium cap layer, so that the germanium cap layer separates the channel layer from the gate dielectric layer. The method further comprises forming a source and drain region at opposing ends of the channel layer. The method further comprises forming a gate region over the gate dielectric layer.

What is claimed is:

1. A transistor device, comprising:
   a layer of semiconductor material overlying a substrate and comprising a source region and a drain region, wherein the source region and the drain region have upper surfaces that are aligned with an upper surface of the layer of semiconductor material;
   a germanium cap layer vertically overlying the upper surface of the layer of semiconductor material;
   a gate dielectric layer vertically overlying the germanium cap layer and separated from the layer of semiconductor material by the germanium cap layer, wherein the germanium cap layer is in direct contact with the layer of semiconductor material and the gate dielectric layer; and
   a gate electrode disposed over the gate dielectric layer and configured to control a flow of charge carriers between the source region and the drain region.

2. The transistor device of claim 1, wherein the layer of semiconductor material comprises a silicon germanium layer having a silicon germanium alloy comprising a molar composition of $Si_{1-x}Ge_x$, wherein x is between approximately 0.25 and approximately 1.

3. The transistor device of claim 1, further comprising:
   sidewall spacers in direct contact with opposing sidewalls of the germanium cap layer along an interface that is aligned with a sidewall of the gate electrode.

4. The transistor device of claim 1, wherein the germanium cap layer has a thickness that is less than a thickness of the gate dielectric layer.

5. A silicon germanium (SiGe) transistor device, comprising:
   a silicon germanium layer disposed over a semiconductor body at a location between a source region and a drain region and comprising a silicon germanium alloy having a molar composition of $Si_{1-x}Ge_x$, wherein x is greater than 0.25;
   a germanium cap layer disposed onto the silicon germanium layer at a location vertically over the source region and the drain region;
   a high-k dielectric layer disposed onto the germanium cap layer, wherein the germanium cap layer is configured to prevent diffusion of germanium atoms from the silicon germanium layer into the high-k dielectric layer; and
   sidewall spacers abutting opposing sidewalls of the germanium cap layer.

6. The SiGe transistor device of claim 5, further comprising:
   a gate region disposed over the high-k dielectric layer.

7. The SiGe transistor device of claim 5, further comprising:
   a germanium oxide ($GeO_2$) layer disposed between the germanium cap layer and the high-k dielectric layer.

8. The SiGe transistor device of claim 5, wherein the germanium cap layer has a thickness having a range of between approximately 10 angstroms and approximately 20 angstroms.

9. The silicon germanium transistor device of claim 5, wherein the germanium cap layer has vertical sidewalls that are aligned with sidewalls of the high-k dielectric layer.

10. A transistor device, comprising:
    a channel layer disposed over a semiconductor body at a location between a source region and a drain region, wherein during operation of the transistor device a conductive channel is formed within the channel layer;

a germanium cap layer disposed onto the channel layer;
a gate dielectric layer, separated from the channel layer by the germanium cap layer, and configured to prevent diffusion of atoms from the channel layer into the gate dielectric layer; and
a gate region disposed over the gate dielectric layer and configured to control a flow of charge carriers between the source region and the drain region, wherein the germanium cap layer is arranged on a planar surface extending along upper surfaces of the source region, the drain region, and the channel layer.

11. The transistor device of claim 10, wherein the germanium cap layer comprises undoped germanium.

12. The transistor device of claim 10, wherein the germanium cap layer has a thickness having a range of between approximately 10 angstroms and approximately 20 angstroms.

13. The transistor device of claim 10, wherein the gate region is a metal gate and wherein the germanium cap layer has vertical sidewalls that are aligned with sidewalls of the metal gate.

14. The transistor device of claim 10, sidewall spacers contacting opposing sidewalls of the germanium cap layer.

15. The transistor device of claim 10, wherein the channel layer comprises a silicon germanium layer having a silicon germanium alloy comprising a molar composition of $Si_{1-x}Ge_x$, wherein x is between 0 and 1.

16. The transistor device of claim 15, wherein x is greater than 0.25.

17. The transistor device of claim 10, wherein the gate dielectric layer comprises:
a germanium oxide ($GeO_2$) layer disposed onto the germanium cap layer; and
a high-k dielectric material disposed onto the $GeO_2$ layer.

18. The transistor device of claim 17, wherein vertical sidewalls of the germanium cap layer are aligned with sidewalls of germanium oxide layer and sidewalls of the high-k dielectric material.

19. The transistor device of claim 17, further comprising:
sidewall spacers abutting opposing sidewalls of the germanium oxide ($GeO_2$) layer.

20. The transistor device of claim 19, further comprising:
a first sidewall spacer disposed onto the source region and abutting a first side of the germanium oxide ($GeO_2$) layer; and
a second sidewall spacer disposed onto the drain region and abutting a second side of the germanium oxide ($GeO_2$) layer, opposing the first side of the germanium oxide ($GeO_2$) layer.

* * * * *